United States Patent [19]

Breitmeier et al.

[11] Patent Number: 5,263,368
[45] Date of Patent: Nov. 23, 1993

[54] HAND-HELD LIGHTNING DETECTION AND RANGING DEVICE

[75] Inventors: James W. Breitmeier, Melbourne Beach; Samuel B. Clubb; Edward F. Shaver, both of Tampa, all of Fla.

[73] Assignee: SkyScan Technologies, Inc., Tampa, Fla.

[21] Appl. No.: 873,786

[22] Filed: Apr. 27, 1992

[51] Int. Cl.$^5$ ............................................. G01R 31/02
[52] U.S. Cl. .................... 73/170.24; 324/72; 342/460
[58] Field of Search ............ 73/170.24; 342/460; 324/72

[56] References Cited

U.S. PATENT DOCUMENTS

| | | |
|---|---|---|
| 3,715,660 | 2/1973 | Ruhnke . |
| 4,023,408 | 5/1977 | Ryan . |
| 4,198,599 | 4/1980 | Krider . |
| 4,276,576 | 6/1981 | Uman . |
| 4,422,037 | 12/1983 | Coleman . |
| 4,803,421 | 2/1989 | Ostrander ............ 73/170.24 |
| 4,823,228 | 4/1989 | Bittne . |
| 4,841,304 | 6/1989 | Richard . |
| 4,873,483 | 10/1989 | Ostrander ............ 73/170.24 |
| 5,057,820 | 10/1991 | Markson . |

FOREIGN PATENT DOCUMENTS 1-136089  5/1989  Japan ................ 73/170.24

Primary Examiner—Kenneth A. Wieder
Assistant Examiner—Jose M. Solis
Attorney, Agent, or Firm—Jerry C. Lyell

[57] ABSTRACT

A hand-held electronic apparatus for the detection and ranging of lightning strikes wherein radio frequency signals from lightning activity are filtered to allow selected low frequency emissions to be compared with standard voltages in order to activate light emitting diodes which correspond to distances to lightning activity: 0–10 miles, 10–20 miles, etc. The device only the electrostatic field component of the radio signals from lightning activity. The electrostatic component typically dominates over the electromagnetic component at comparatively short distances of 40 miles or less.

11 Claims, 2 Drawing Sheets

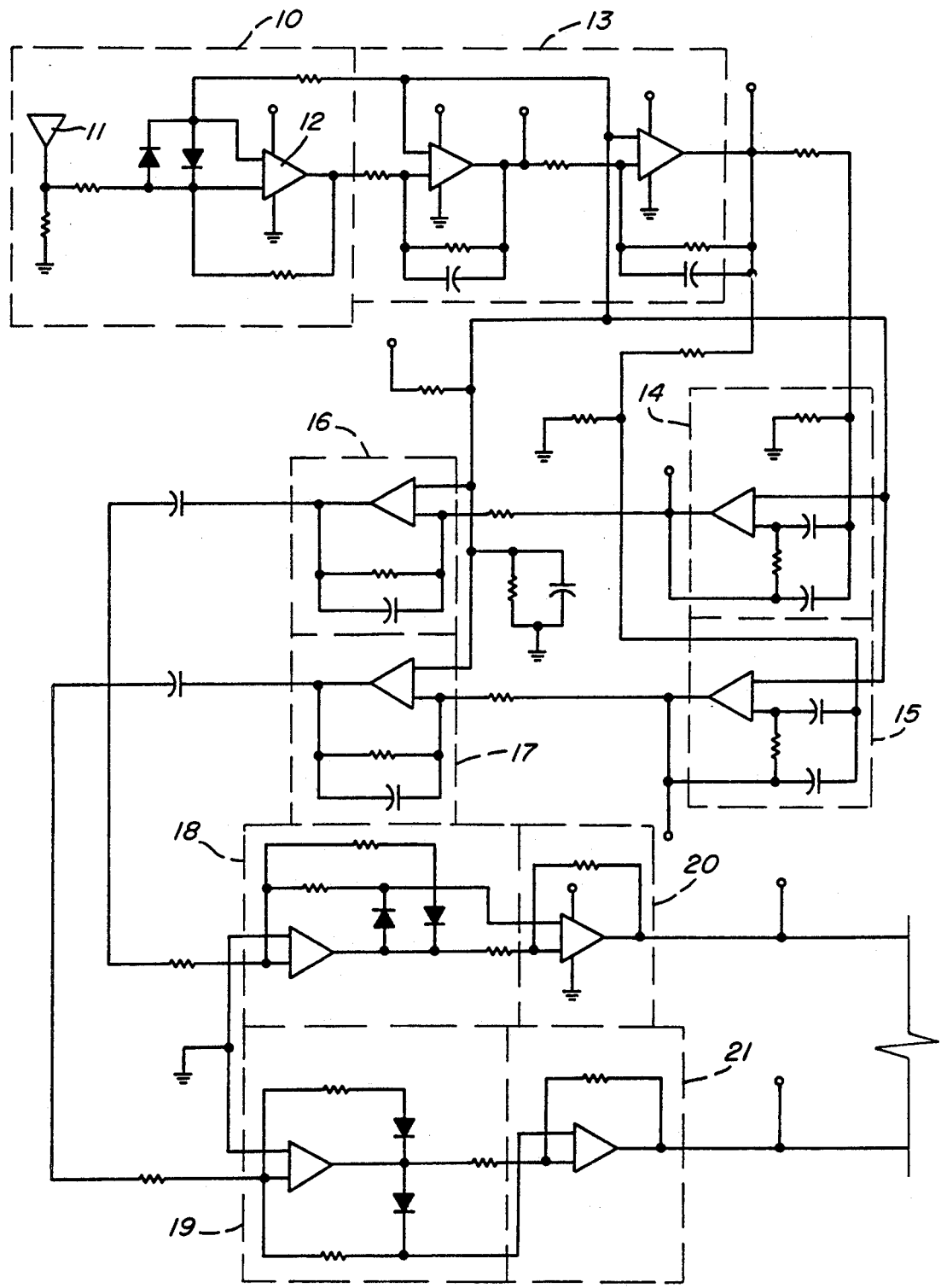
FIG. IA

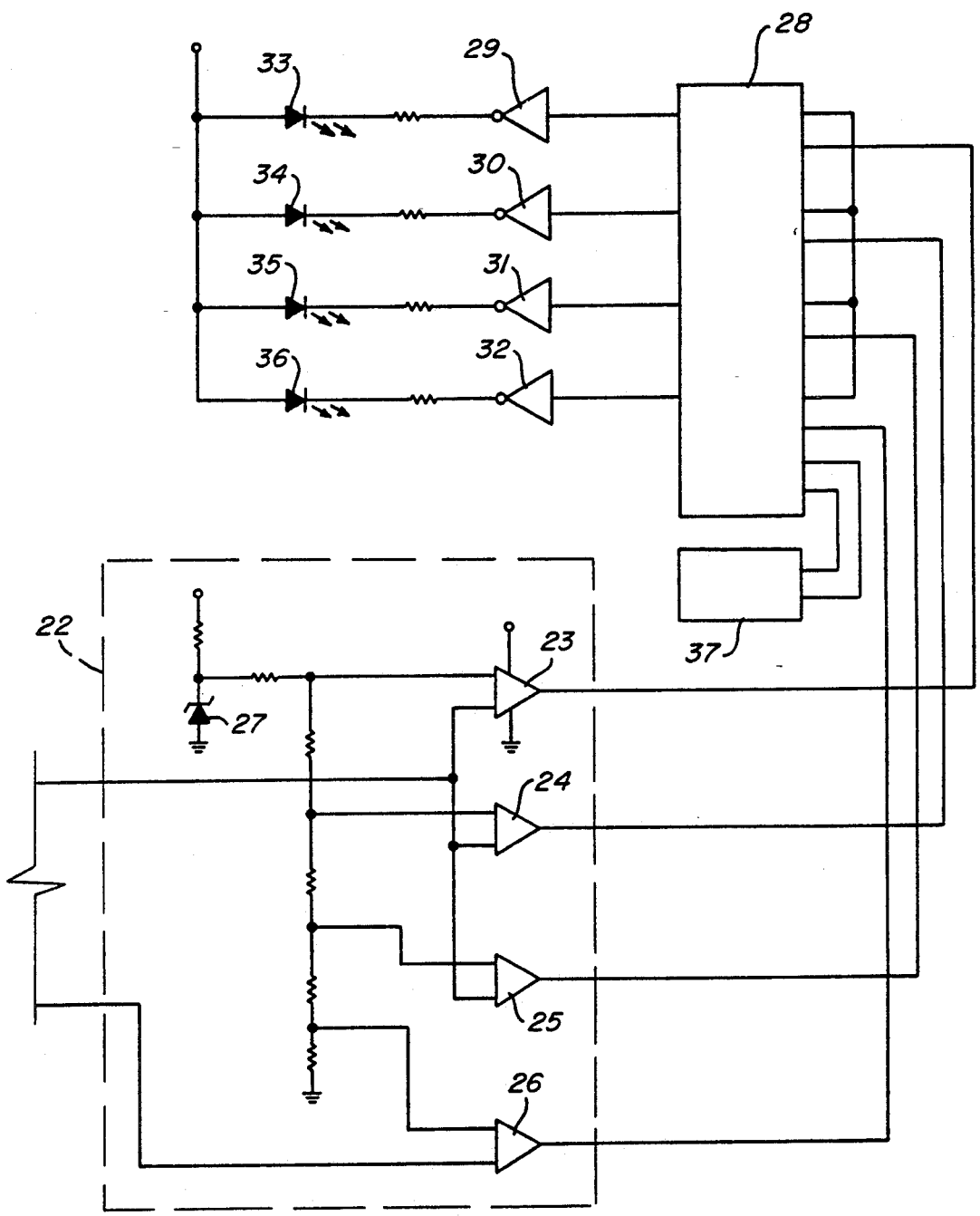
FIG. IB

HAND-HELD LIGHTNING DETECTION AND RANGING DEVICE

BACKGROUND OF THE INVENTION

This invention relates to a small, self-contained apparatus for the detection and ranging of lightning discharges. The device is sufficiently small to be carried in the hand and in the pockets of normal garments of apparel.

Previous developments in the field of lightning detection include ranging systems in which the distance to lightning strokes is determined (U.S. Pat. No. 3,715,660, Ruhnke) and more elaborate devices which display both azimuth and distance to lightning activity (U.S. Pat. No. 4,023,408, Ryan et al; U.S. Pat. No. 4,422,037, Coleman). These inventions typically employ cross-loop antennas to detect the magnetic field component of the radiation which emanates from lightning activity and nondirectional radio antennas to detect the electric component. Comparisons of the magnetic and electric field strengths then yield approximate distances to lightning strikes.

Some devices include components which perform waveform analysis in order to distinguish lightning activity from other natural or manmade electromagnetic radiation (U.S. Pat. No. 4,198,599, Krider et al).

Other systems employ principals of interferometry to locate lightning activity (U.S. Pat. No. 4,841,304, Richard et al) or the phenomena of induced corona discharge to detect the potential of lightning strikes (U.S. Pat. No. 4,823,228, Bittner).

Most such devices are conceived as fixed, land based installations or airborne instruments involving substantial size, weight and expense.

Those aforementioned devices that measure distances to lightning activity based upon comparisons of the electrostatic and magnetic field components emanating from lightning discharges rely upon a composite field equation:

$$E(t) = \frac{1}{4\pi\epsilon} \left[ \frac{M(t)}{D^3} + \frac{1}{cD^2} \frac{dM(t)}{dt} + \frac{1}{c^2D} \frac{d^2M(t)}{dt^2} \right] \quad (1)$$

where D=the distance to the electromagnetic disturbance and c=the speed of light.

The first term of the equation represents the electrostatic field component, the second term the inductive field, and the third term the radiation field component. Inspection of equation (1) reveals the first term to be the most sensitive indicator of distance between detector and source of lightning induced fields. Accordingly, the present invention focuses upon the detection of the electrostatic field as a means of determining distance to lightning strikes.

Given that peak current flow in lightning discharges has been estimated to vary between 7,000 and 28,000 amperes (Ryan, U.S. Pat. No. 4,023,408), and that fluctuations in signal strength need to be controlled for in order to more accurately estimate distance, the present invention selectively detects and analyzes a plurality of signals in the very low frequency range (1,400 hz and 700 hz in this instance) rather than relying merely upon quantitative comparisons of signal amplitude alone.

Ryan mentions that lightning strokes of greater than average peak current flow appear to be closer than they actually are as displayed on the Stormscope and strokes of lower than average peak current appear further away. This condition is referred to as "error" although it may be considered to be "useful approximation" if one's concern is merely to remain as far away as possible from any lightning activity.

The significance of distance measurement through low frequency signal detection becomes clearer if equation (1) is expressed as a function of frequency E(w) where w=observation frequency in radians per second (rad./sec.).

$$E(w) = \frac{M(w)}{4\pi\epsilon} \left[ \frac{1}{D^3} + \frac{jw}{cD^2} + \frac{(jw)^2}{c^2D} \right] \quad (2)$$

As in equation (1) the three terms correspond to the electrostatic, inductive and radiation fields, but it should be noted that the electrostatic component can be made to dominate at any distance by an appropriate selection of frequency. The operant equation for this purpose is $$D_c + c/w \quad (3)$$

where $D_c$=critical distance in miles and c=the speed of light in miles per second (miles/sec.).

SUMMARY OF THE INVENTION

The present invention is a hand-held instrument for the detection and ranging of lightning strokes within a radius of about 40 miles of the observer. In one embodiment radio frequency signals from lightning discharges are detected and amplified, then channeled through two band-pass filters centered at 700 and 1,400 hertz. The signal in the 700 hertz channel is fed through an absolute value circuit to a single comparator which is referenced to a zener diode. This signal is then digitized and fed to one light emitting diode (LED) corresponding to the longest range of detection. The 1,400 hertz signal, corresponding to a shorter range, can be channeled through a plurality of comparator circuits each referenced to a standard voltage resulting in a scaling down of this signal such that the separate outputs correspond to selected distance ranges similar to the first embodiment. The shorter range (1,400 hertz) signal will typically be stronger and therefore easier to scale in this manner than the 700 hertz signal.

The separate comparator outputs from the 1400 hertz channel are also digitized and used to drive a plurality of LEDs, each of which correspond to a selected distance range, i.e., 0–10 miles, 10–20 miles, etc.

In a second embodiment the circuitry involves channeling the input signals into a plurality of band-pass filters which are centered at two or more stepped frequencies typically between 700 and 1,400 hertz. The filtered signals then proceed via separate channels through absolute value circuits, thence through a plurality of comparator circuits which are referenced to voltages divided down from one or more zener diodes. The output of the comparator circuits on separate channels corresponds to selected distance ranges from the detector to a lightning strike; i.e., the 700 hertz signal output, if any, would correspond to a distance of approximately 42 miles to lightning. Higher frequency outputs, if any, would correspond to progressively shorter distances pursuant to equation (3).

This invention also embodies additional digital control functions which include such capabilities as a HOLD function, an ALARM mode and a TEST function.

When the device is in the HOLD mode, the LED display is deactivated. When removed from the HOLD mode, the device displays the strongest signal that was received during the HOLD period, and then returns to normal operation.

An ALARM feature can be activated whereby an audible signal will be generated in addition to illumination of the LEDs.

A TEST switch provides a momentary application of voltage to the absolute value circuit which drives the LED indicators to a full-scale reading in order to verify proper operation of the device.

BRIEF DESCRIPTION OF THE DRAWINGS

The invention may be further understood by reference to the drawings in which:

FIGS. 1A and 1B are schematic diagrams of a preferred embodiment of the invention.

DESCRIPTION OF THE PREFERRED EMBODIMENT

Referring now to FIG. 1 of the drawings, one embodiment of the invention is shown wherein a signal detection stage 10 comprises an antenna 11 leading to a unity gain amplifier 12, thence to a plurality of staged, inverting operational second amplifiers 13 with a combined gain of 1000. The output from the operational amplifiers 13 is then fed to two band-pass filters 14 and 15 via separate channels. Said band-pass filter 14 is centered at a frequency of 1400 hertz and filter 15 is centered at 700 hertz.

Band widths are imposed on the signals by utilizing Q-factors of approximately 2 for the 1,400 hertz signal and approximately 10 for the 700 hertz signal.

The filtered signals next pass through inverting amplifiers 16 and 17 with a gain of 10 followed by absolute value circuits 18 and 19 to obtain nonpolarized signals which are then further amplified by unity gain inverting followers 20 and 21.

The signals emanating from the inverting operational amplifiers 20 and 21 are scaled analog pulses bearing a direct relationship to the distance to lightning strokes.

The analog signals are then fed via two channels into a comparator circuit 22 comprised of a plurality of inverting operational amplifiers 23, 24, 25 and 26 which are referenced to voltages divided down from a reference voltage derived from a zener diode 27.

In the present embodiment the signal output from the 1,400 hertz channel is fed into inverting operational amplifiers 23, 24 and 25 which are, as noted above, referenced to voltages divided down from said zener diode 27. The signal output from the 700 hertz channel is fed to inverting amplifier 26 which is similarly referenced to zener diode 27. The signal output from the comparators is digital.

The comparator signals are then input into an R/S Latch 28 which holds the digital input until released for display by timing circuit 37. This output, in turn, drives a plurality of Hex Inverting Buffers 29, 30 31, and 32 which provide outputs via parallel channels to a plurality of LEDs 33, 34, 35 and 36 which comprise the visual ranging display. Said timing circuit 37 holds the signal on the LEDs for a predetermined time before recycling.

The foregoing array of components enables this invention to be constructed in a compact and lightweight manner suitable for hand-held operation. The relative simplicity of this invention also makes it far less costly to manufacture and market than other lightning detectors currently available.

It should be noted that the stated values for the components of this device can vary without departing from the spirit or concept of the invention.

We claim:

1. A lightning detection and ranging device comprising:
   an antenna means for detecting the electric field signals produced by lightning discharges;
   a first amplifier means for increasing the amplitude of said electric field signals;
   a second staged amplifier means for increasing the amplitude of said electric field signals;
   a filter means for limiting the frequencies of said electric field signals to selected values;
   a third amplifier means to further increase the amplitude of said electric field signals;
   an absolute value circuit means for inverting half waves of said electric field signals to obtain nonpolarized signals;
   a fourth amplifier means to further increase the amplitude of said nonpolarized signals;
   a plurality of comparator means for comparing said nonpolarized signals to selected reference voltages and for converting said signals into digital form;
   an electronic component means for holding said digital signals until released for display; and
   a plurality of light emitting diodes activated by said digital signals.

2. The device as recited in claim 1 wherein said first amplifier means has a front-end protective circuit.

3. The device as recited in claim 1 wherein said second staged amplifier means has a gain of 1000.

4. The device recited in claim 1 wherein said filter means comprises a first-band pass filter and a second band-pass filter.

5. The device as recited in claim 4 wherein said first band-pass filter is centered at a frequency of 1400 hertz.

6. The device as recited in claim 4 wherein said second band-pass filter is centered at a frequency of 700 hertz.

7. The device as recited in claim 5 wherein said first band-pass filter has a Q-factor of approximately 2.

8. The device as recited in claim 6 wherein said second band-pass filter has a Q-factor of approximately 10.

9. The device as recited in claim 1 wherein said third amplifier means has a gain of 10.

10. The device as recited in claim 1 wherein said fourth amplifier means comprises a plurality of unity gain followers.

11. The device as recited in claim wherein said electronic component means comprises an R/S Latch.

* * * * *